(12) United States Patent
Pierson, Jr. et al.

(10) Patent No.: US 7,354,820 B2
(45) Date of Patent: Apr. 8, 2008

(54) HETEROJUNCTION BIPOLAR TRANSISTOR WITH DIELECTRIC ASSISTED PLANARIZED CONTACTS AND METHOD FOR FABRICATING

(75) Inventors: Richard L. Pierson, Jr., Thousand Oaks, CA (US); James Chingwei Li, San Diego, CA (US); Berinder P. S. Brar, Newbury Park, CA (US); John A. Higgins, Westlake Village, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 370 days.

(21) Appl. No.: 11/227,858

(22) Filed: Sep. 14, 2005

(65) Prior Publication Data

US 2006/0121669 A1 Jun. 8, 2006

Related U.S. Application Data

(62) Division of application No. 10/256,042, filed on Sep. 26, 2002, now Pat. No. 6,949,776.

(51) Int. Cl.
*H01L 21/8249* (2006.01)
(52) U.S. Cl. ............... 438/235; 438/320; 438/606; 257/E21.387
(58) Field of Classification Search ........... 438/235, 438/312, 320, 606, 607, 645; 257/E21.387
See application file for complete search history.

(56) References Cited

U.S. PATENT DOCUMENTS

| 4,996,165 | A | | 2/1991 | Chang et al. ............. 437/31 |
| 5,665,614 | A | * | 9/1997 | Hafizi et al. ............. 438/320 |
| 6,020,246 | A | * | 2/2000 | Koscielniak et al. ...... 438/341 |

OTHER PUBLICATIONS

Wang, Introduction to Semiconductor Technology, GaAs and Related Compounds, John Wiley & Sons (1990), pp. 170-230.

* cited by examiner

*Primary Examiner*—Chandra Chaudhari
(74) *Attorney, Agent, or Firm*—Koppel, Patrick, Heybl & Dawson

(57) ABSTRACT

A method for fabricating an HBT is disclosed, wherein successive emitter, base, collector and sub-collector epitaxial layers are deposited on a substrate, with the substrate being adjacent to the sub-collector layer. The epitaxial layers are etched to provide locations for contact metals and emitter, base and contact metals are deposited on the emitter, base and sub-collector epitaxial layers, respectively. A self-alignment material is deposited on the surface of the substrate around the epitaxial layers and a planarization material is deposited on and covers the top surface of the HBT. The planarization material is then etched so it has a planar surface about the same level as the surface of the self-alignment material and the contact metals protrude from the planar surface. The planar metals are then deposited over the protruding portions of the contact metals.

7 Claims, 6 Drawing Sheets

HETEROJUNCTION BIPOLAR TRANSISTOR WITH DIELECTRIC ASSISTED PLANARIZED CONTACTS AND METHOD FOR FABRICATING

This application is a divisional of patent application Ser. No. 10/256,042, filed on Sep. 26, 2002 now U.S. Pat. No. 6,949,776.

BACKGROUND OF THE INVENTION

1. Field of the Invention

This invention relates to semiconductor devices, and more particularly to planarized contacting of semiconductor devices such as high power heterojunction bipolar transistors (HBTs).

2. Description of the Related Art

HBTs are described in general in Wang, *Introduction to Semiconductor Technology: GaAs and Related Compounds* John Wiley & Sons, 1990, pp. 170-230. Some of the advantages of HBTs over other transistors such as FETs include; short transition times because of their vertical structure, higher current handling capability per unit chip area, which contributes to higher output drive capabilities, and increased transconductance.

There is a continuing need to develop integrated circuits and components, including HBTs, which operate at higher frequency or speeds, with reduced power. This design goal places a greater emphasis on increased component integration and packing density, which results in decreased feature sizes, increased interconnection complexity and use of new or specialized materials.

One of the concerns in fabricating semiconductor devices such as HBTs is reliably making electrical contact to the different epitaxial layers (emitter, base and collector layer for HBTS), and isolating devices electrically by eliminating or rendering inactive the epitaxial layers outside of the transistors. In fabricating conventional HBTs, epitaxial layers are grown vertically to form the HBT's active layers. To contact the HBT's emitter layer a contact metal can be deposited on the device's top surface, which is generally an emitter contact layer. To contact the base layer, the emitter contact layer and emitter layer are etched (except under the emitter contact) to provide a surface on the base layer for depositing a contact metal. To contact the collector layer, portions of the emitter contact layer, emitter layer, base layer and collector layers are etched to provide a surface on a sub-collector layer for depositing the contact metal.

Before electrical connection to the contact metals, conventional HBTs are covered with a passivation material. The emitter, base and collector metals are then contacted through the passivation material, by etching a via pathway through the passivation material down to each contact metal. A conductive material is then deposited in the etched areas to form conductive vias to the contact metals. Electrical connection is made to the HBT's active layers by connection to the conductive vias.

One disadvantage of this technique is that it cannot be used to reliably contact high speed HBTs. To increase the speed of HBTs, the emitter becomes smaller and the size of the emitter correlates to the size of its contact metal. As the emitter is reduced, a point is reached where the emitter metal cannot be reliably contacted by using conductive vias. The resolution and alignment limits of lithography and etch systems limit how small the device features can be for HBTs. The smallest resolution for etching a via through polymide or BCB over an emitter metal is approximately 0.5 μm. The emitter should be 0.2 μm wider than the width of the via to provide a margin of error in case the via is not perfectly aligned over the emitter metal. Accordingly, the smallest the emitter can be is approximately 0.75 μm wide.

Another concern is that for smaller emitters the via etch may not align with the emitter metal. This can result in the etch extending beyond the emitter metal to the epitaxial layer. When the via etch is filled with the conductive material to form the via, the conductive material can form a short to the epitaxial material that bypasses the emitter metal, emitter contact layer and emitter layer. This naturally results in a greater number of fabrication errors, making the HBTs less reproducible.

Planarization has been used to remedy surface topologies that can create problems for a semiconductor device's performance and survivability [See U.S. Pat. No. 4,996,165 to Chang et al.]. Variations in feature height, topography or morphology can lead to stress in subsequently deposited layers or materials and height variations in one layer can make precise control of the dimensions of subsequent layers difficult. The features of a semiconductor device are formed by depositing a layer of photoresist on an upper layer of the structure and developing it in a desired pattern. After development and etching, some photoresist remains on the upper surfaces of the features. A layer of dielectric material such as SiO is deposited across the semiconductor structure to a depth substantially the same as the height of the tallest features. The remaining photoresist is then removed along with the dielectric deposited thereon. A layer of polymide is deposited on the upper surface of the SiO and features, and extends into depressions between to control the height variations.

SUMMARY OF THE INVENTION

The present invention seeks to provide a semiconductor device such as an HBT, where the size of the device is not limited by the resolution of via etching. The invention also seeks to provide a reliable semiconductor device that is readily reproducible.

These goals are realized by a multi-layered semiconductor embodiment of the present invention, which includes a plurality of successive epitaxial layers and a plurality of contact metals electrically contacting a respective one of the epitaxial layers. A planarization material is included that covers the uncovered portions of the epitaxial layers and covers substantially all of the contact metals. The planarization material has a substantially planar surface from which a portion of each of the contact metals protrudes. Planar metals are included on the planar surface, with each of the planar metals electrically isolated from the other and in electrical contact with the protruding section of a respective one of the contact metals.

The present invention is particularly applicable to HBTs that include successive emitter, base and collector layers and emitter, base and collector contact metals electrically contacting their respective layer. A passivation material is included that covers the uncovered portions of the emitter, base and collector layers and covers substantially all of the contact metals. The passivation material has a substantially planar surface from which a portion of each of the contact metals protrudes. The HBT also includes a first, second and third planar metal on the substantially planar surface, each planar metal in electrical contact with a respective contact metal.

The present invention also discloses a method for fabricating multi-layered semiconductor devices, one embodiment of which includes depositing a plurality of successive epitaxial layers on a substrate, with the substrate extending laterally beyond said epitaxial layers. A plurality of contact metals are deposited on the epitaxial layers, and a layer of self alignment material is deposited on the substrate, around but not contacting the epitaxial layers or contact metals. A planarization material is deposited over the self-alignment material, the epitaxial layers and the plurality of contact metals. The planarization material is then etched so it has a planar surface about the same level as the surface of the self-alignment material, and the plurality of contact metals protrude from the planar surface. Planar metals are then deposited on the planar surface with each of the planar metals isolated from the others and each in electrical contact with a respective one of the contact metals.

Another embodiment of a method according to the present invention is also disclosed that is particularly adapted to fabricating HBTs. Successive emitter, base, collector and sub-collector epitaxial layers are deposited on a substrate, with the substrate being adjacent to the sub-collector layer. The epitaxial layers are etched to provide locations for metal contacts, and emitter, base and contact metals are deposited on the emitter, base and sub-collector epitaxial layers, respectively. A self-alignment material is deposited on the surface of the substrate around the epitaxial layers and a planarization material is deposited on and covers the top surface of the HBT. The planarization material is then etched so it has a planar surface about the same level as the surface of the self-alignment material and the contact metals protrude from said planar surface.

The new device and method allows for fabricating devices without relying on etching conductive vias for contacting the contact metals. The new method results in devices that are more reproducible and reliable and less complicated to fabricate. Also, the size of the device is not limited by the resolution of the via etching. Smaller devices can be fabricated, which can result in faster devices that consumes less power.

These and other further features and advantages of the invention will be apparent to those skilled in the art from the following detailed description, taken together with the accompanying drawings, in which:

DETAILED DESCRIPTION OF THE INVENTION

Figure 1:
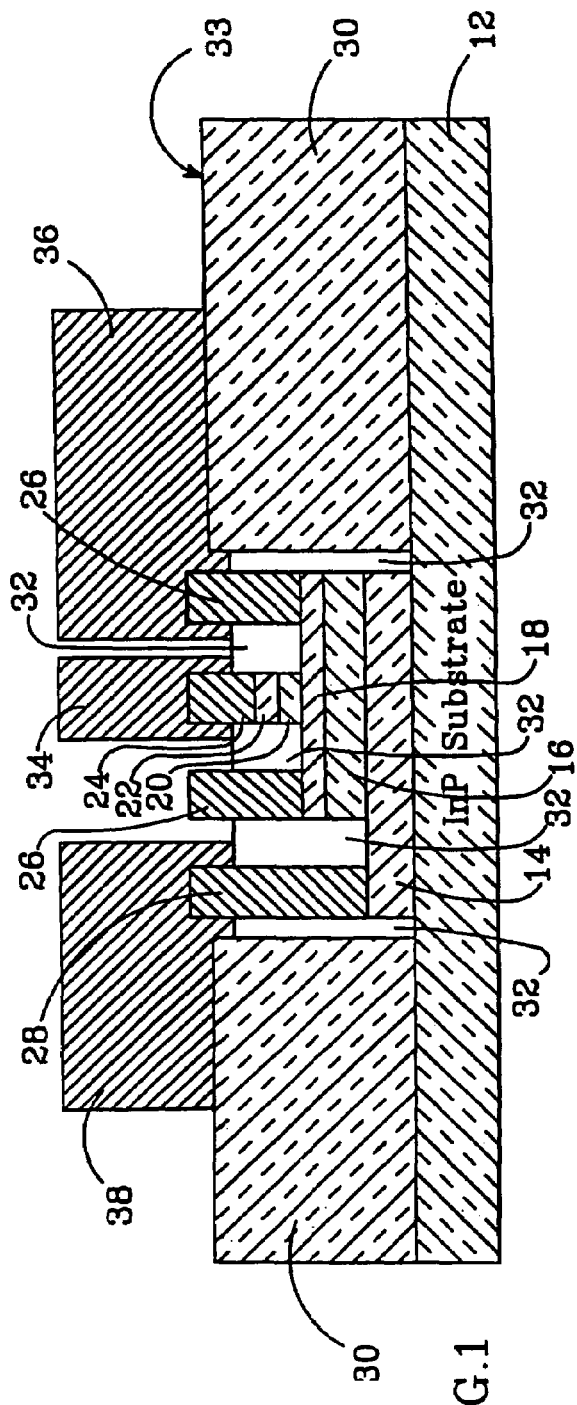
FIG. 1 is a sectional view of one embodiment of a multi layered semiconductor device (HBT) according to the present invention.

FIG. 1 shows one embodiment of an HBT 10 according to the present invention. It is formed on an electrically semi-insulating InP substrate 12, which supports an InP sub-collector 14, with the substrate extending laterally beyond the sub-collector layer 14. The sub-collector 14 is heavily doped n+ so that it is substantially conductive. The sub-collector 14 is typically about 0.5-1 micron thick, with a dopant concentration of greater than $1 \times 10^{19}/cm^3$. The purpose of the sub-collector 14 is to establish an electrical contact with the collector layer 16, which normally directly contacts the upper surface of the sub-collector 14. The collector 16 is typically about 0.2-1.0 microns thick, with a dopant concentration of about $1 \times 10^{16}$ to $1 \times 10^{17}/cm^3$. The collector layer is typically doped with silicon (Si) during the epitaxial growth.

A heavily doped InGaAs base layer 18 is included on the collector layer 16 opposite the sub-collector layer 12, with the base layer 18 covering most of the collector layer 16. The sub-collector 14 layer extends laterally beyond said collector layer 16. The base layer 18 is typically about 300-1000 Angstroms thick and carbon doped p++ to a concentration of about $5 \times 10^{19}/cm^3$. An InP emitter layer 20 is on the base layer 18 and normally directly contacts the base layer's upper central surface. The emitter layer 20 is typically about 400 to 2000 Angstroms thick and n doped to a concentration of about $3 \times 10^{17}/cm^3$. The emitter could alternatively be formed of InAlAs. The emitter layer 20 has an InGaAs emitter contact layer 22, which is typically n doped to a concentration of about $1 \times 10^{19}/cm^3$ and is greater than approximately 200 Angstroms thick. Emitter, base and collector contact metals 24, 26, 28 are included to electrically contact the emitter, base and sub-collector layers 20, 18, 16, respectively. The emitter contact metal 24 is on and covers the emitter contact layer 22. The base contact metal 26 is deposited directly on the base layer 18 where the emitter layer 20 and emitter contact layer 22 have been etched. The collector contact metal 28 is deposited on the sub-collector layer 12 in an area where the emitter contact layer 22, emitter layer 20 and base layer 18 have been etched.

A layer of SiO 30 surrounds, but does not cover or contact the active layers or contact metals of the HBT 10. The SiO layer 30 allows for self-alignment during fabrication, so various device features can be defined with the same photoresist pattern. This avoids the relatively wide spaces that would otherwise be needed for photolithography alignment tolerances. Using self-alignment, the spacing between regions defined on different mask layers can be reduced.

In accordance with the present invention, electrical contact is not made to the contact metals 24, 26 and 28 through conductive vias. Instead, contact is made by depositing metals on a planarized surface in electrical contact with the HBT's contact metals. A planarization material 32, such as a polymide or Benzocyclobutenes (BCB), which also passivates the surfaces of the active layers, fills the open spaces of the HBT 10 between the SiO layer, covering the HBT's active layers and most of the contact metals 24, 26, 28. Only a small section of the top of the metals 24, 26, 26 is not covered by the passivation material 32. The top surface of the passivation material 32 should be at substantially the same level as the top surface of the SiO layer 30, but can be slightly lower (as shown) or slightly higher.

The top surface of the passivation material and the SiO layer provide a substantially level surface 33 for electrically contacting the contact metals 24, 26, 28. Electrical contact is made to the emitter metal 24 by depositing a first planar metal 34 over the portion of the emitter metal 24 that protrudes from the passivation material 32. Electrical contact is similarly made to the base metal 26 by depositing a second planar metal 36 base metal's protruding portion. The second planar metal 36 takes advantage of the adjacent surface of the SiO layer to provide a larger planar surface. Electric contact is made to the collector metal 28 by depositing a third planar metal 38 over the protruding portion of the collector metal 28 and third planar metal 38 also takes advantage of the adjacent surface of the SiO layer 30. Each of the planar metals is typically 1.0 μm thick and can be made of any conductive material, but is preferably made of a metal such as Ti, Pt or Au. All three planar metals can be deposited at the same time.

By electrically contacting the contact metals 24, 26, 28 over a planar surface instead of through conductive vias, the size of the emitter is not limited by the tolerance of the via lithography or etching process. Electrical contact is made without having to etch for a via. The size of the planar metals 34, 36, 38 can remain the same independent of the size of the emitter and its contact metal. Using smaller emitters, HBTs smaller can be fabricated with smaller features that operate at an increased speed with reduced power consumption.

Figure 2:
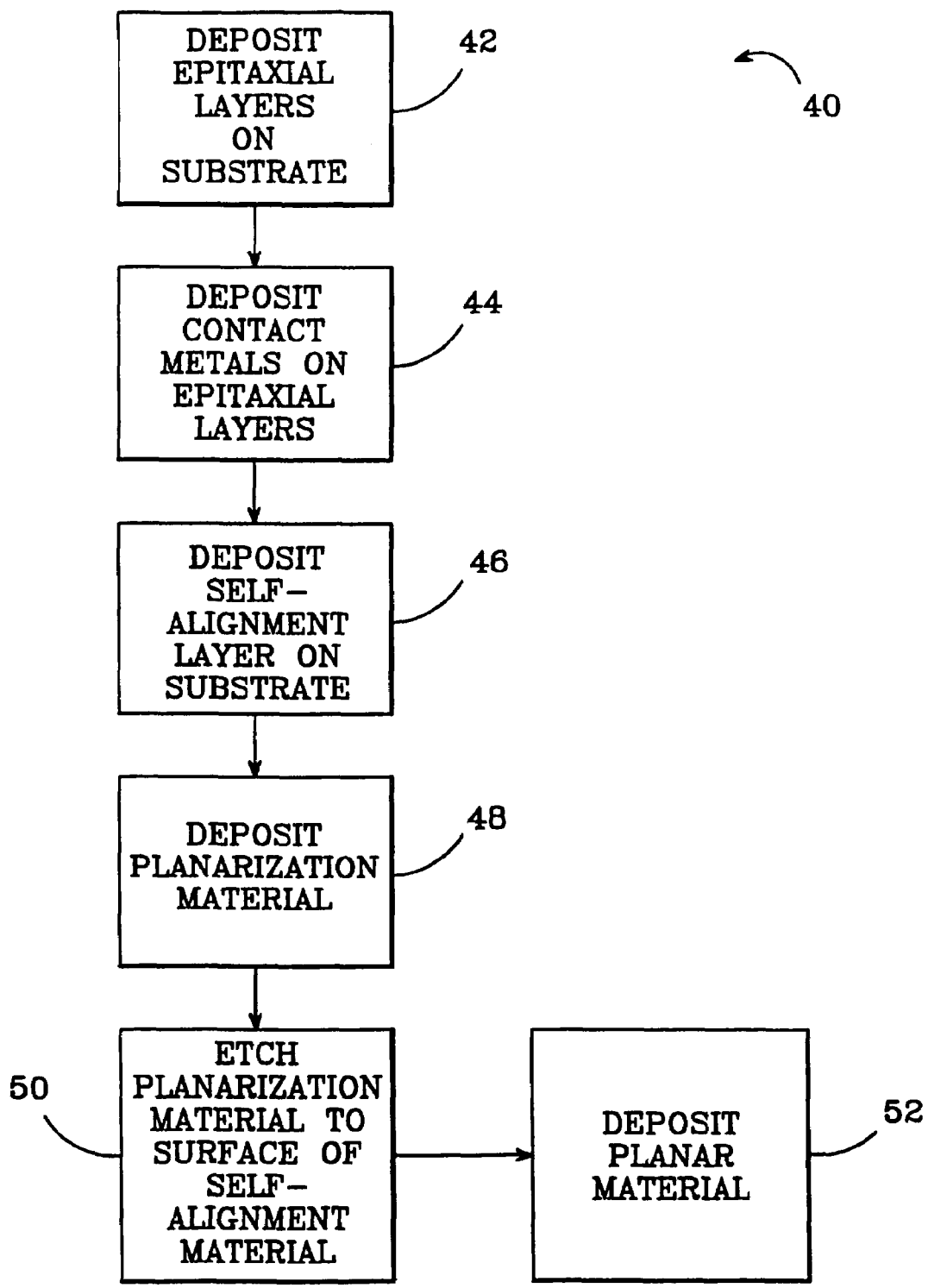
FIG. 2 is a flow diagram for one embodiment of a fabrication method according to the present invention.

FIG. 2 is a flow diagram of one embodiment of a semiconductor fabrication method 40 according to the present invention. The method 40 can be used to fabricate many different semiconductor devices and is particularly adapted to providing planar metals to electrically contact the device's epitaxial layers.

In step 42, the epitaxial layers are deposited on a substrate using standard deposition techniques. In step 44, metal contacts are deposited on the epitaxial layers using standard deposition techniques such as sputtering. In step 46, a self-alignment layer is deposited on the substrate around the epitaxial layers. The top surface of the self-alignment layer is preferably just below the top of the contact metals. In step 48, a planarization material is then deposited, which covers the exposed surface of the entire device.

In step 50, the planarization material is etched using standard etching techniques such as reactive ion etching (RIE), so that the material is substantially at the same level as the surface of the self-alignment layer and a portion of each of the contact metals protrudes from the surface of the planarization material. In step 52, respective planar metals are deposited over protruding portions of the contact metal, again using standard deposition techniques. The planar metals are on the surface of the planarization material or on the surface of the planarization material and the self-alignment layer. Each of the planar metals is preferably electrically isolated from the other(s) and contacts a respective contact metal.

Figure 3:
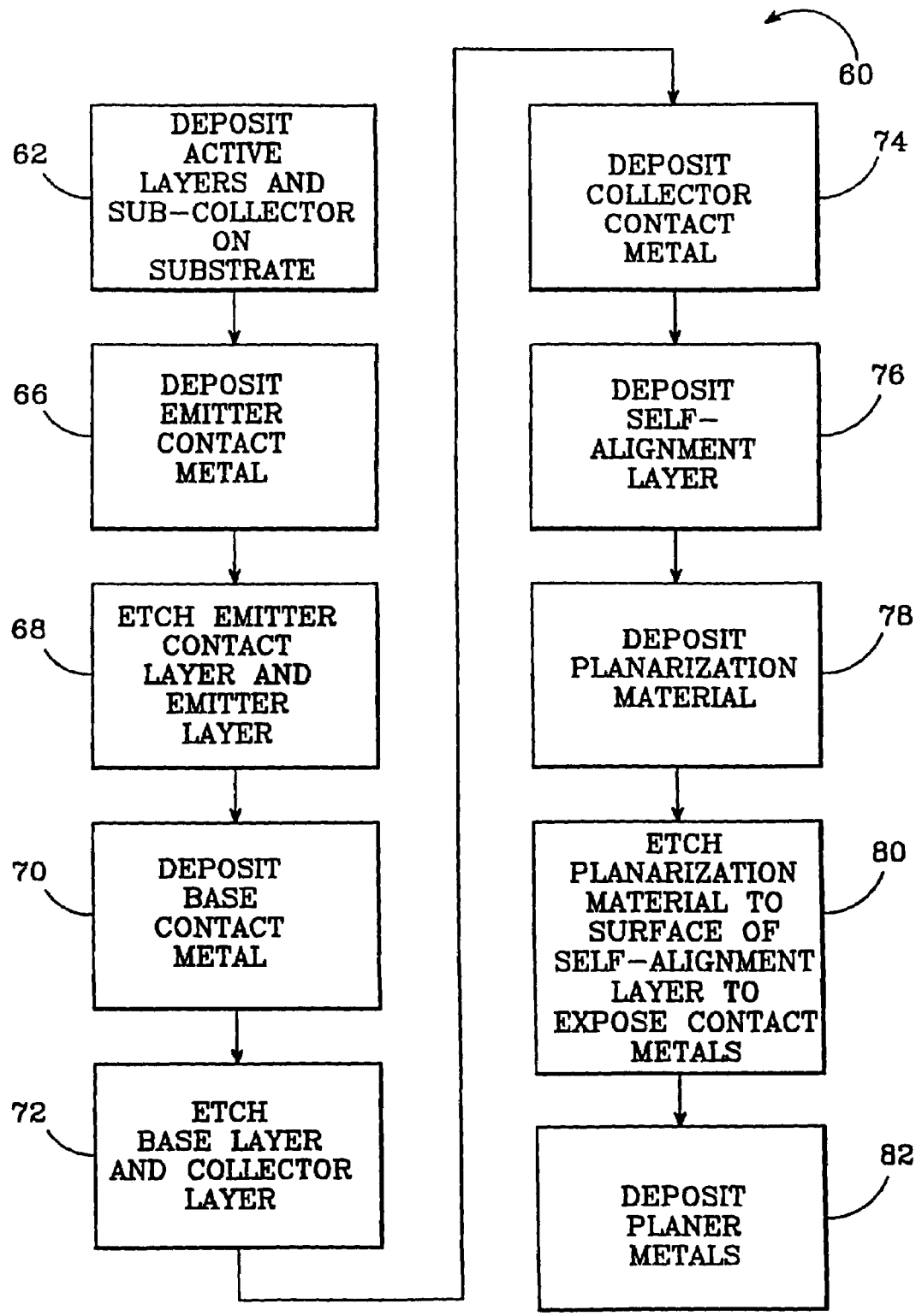
FIG. 3 is a flow diagram of another embodiment of a fabrication method according to the present invention, which is particularly adapted to HBTs.

FIG. 3 is a flow diagram of another embodiment of a fabrication method 60 according to the present invention, that is particularly adapted to fabricating HBTs of the type shown in FIG. 1. FIG. 3 will be referenced in conjunction with FIGS. 4-10, which show the HBT 10 at different steps in the fabrication method 60 of FIG. 3. Where the layers/features are the same as those in FIG. 1, the same reference numerals will be used in FIGS. 4-10.

Figure 4:
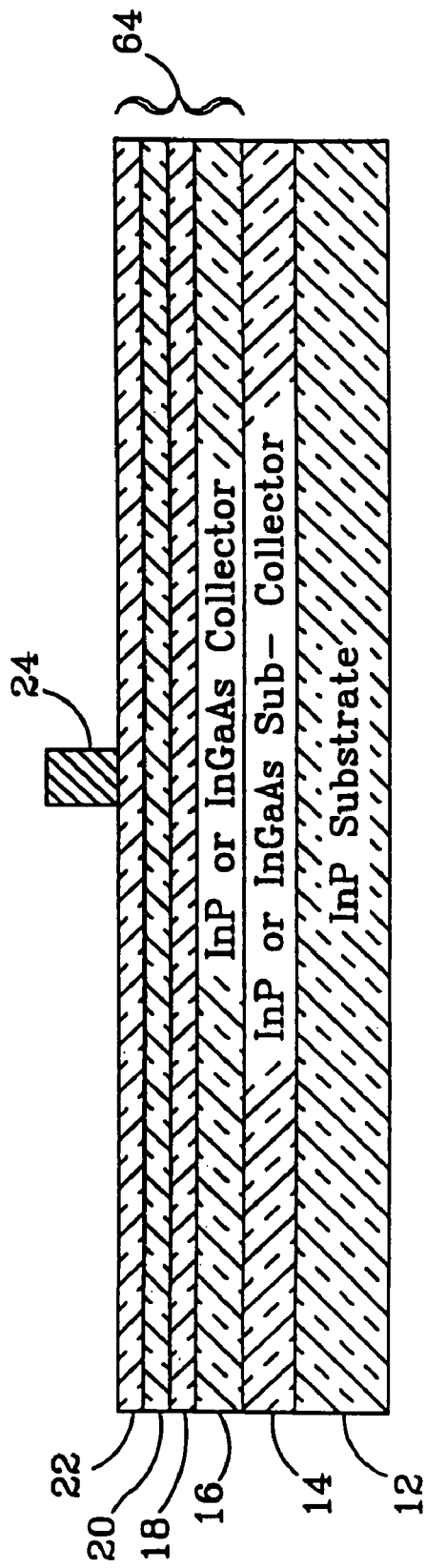
FIG. 4 is a sectional view of an embodiment of an HBT according to the present invention in one of its initial fabrication steps using the method of FIG. 3.

In step 62 and as shown in FIG. 4, the active layers 64 of an HBT are deposited on a substrate 12 by epitaxial growth techniques such as molecular beam epitaxy (MBE) or metalorganic chemical vapor phase deposition (MOCVD). The active layers 64 generally comprise the collector, base and emitter layer 16, 18, 20, with an emitter contact layer 22 being included on the emitter layer 20. The active layers 64 can be made from many different material systems including but not limited to the InP/InGaAs material system described above in FIG. 1. A sub-collector layer 14 is included adjacent the collector layer 16, with all of the layers being fabricated on a substrate 12. The sub-collector 14 is preferably adjacent the substrate 12 and both can be made of many different materials, with suitable materials being InP or InGaAs.

Figure 5:
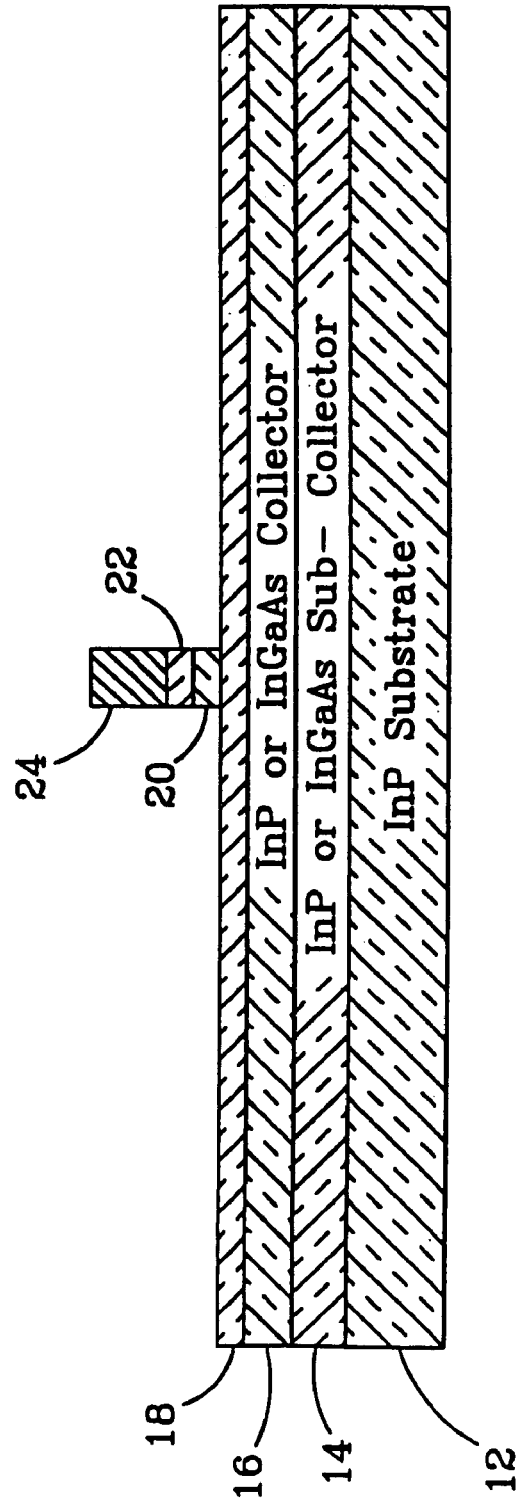
FIG. 5 is sectional view of the HBT in FIG. 4 after a subsequent fabrication step using the method of FIG. 3.
Figure 6:
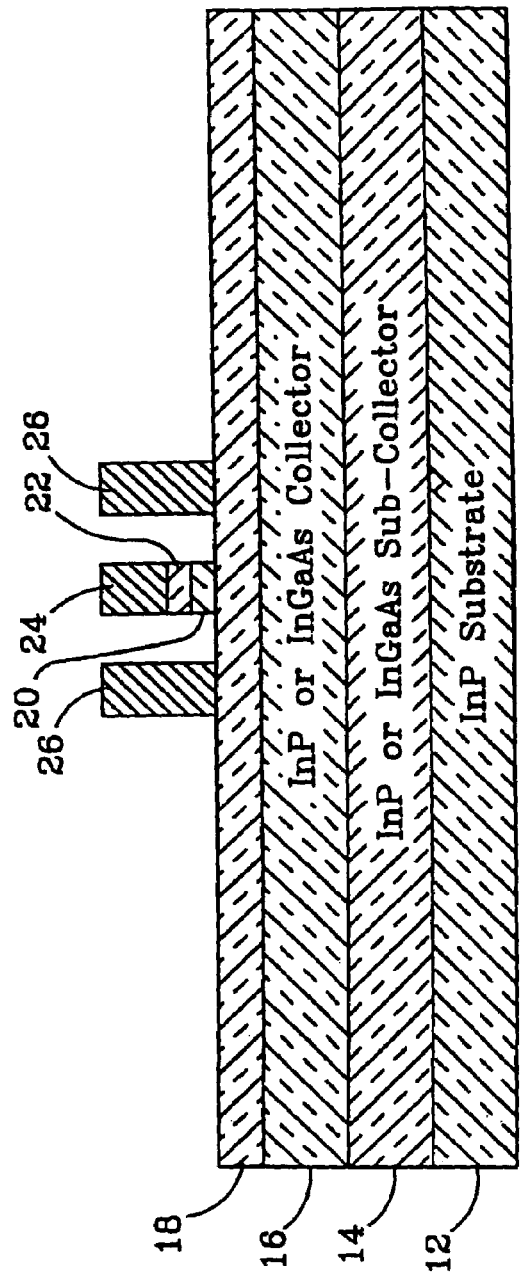
FIG. 6 is a sectional view of the HBT in FIG. 5 after a subsequent fabrication step using the method of FIG. 3.

In step 66 and as further shown in FIG. 4, an emitter metal 24 is deposited on the HBT 10 using standard deposition techniques, such as sputtering. In a preferred method the emitter metal 24 is deposited on the emitter contact layer 22. In step 68 as shown in FIG. 5, the emitter contact layer 22 and the emitter layer 20 are etched to the base layer 18, except for the portion of these layers under the emitter contact metal 24, with a suitable etching technique being RIE. In step 70 as shown in FIG. 6, the base contact metal 26 is then deposited directly on the base layer 18, with a suitable deposition technique also being evaporation.

Figure 7:
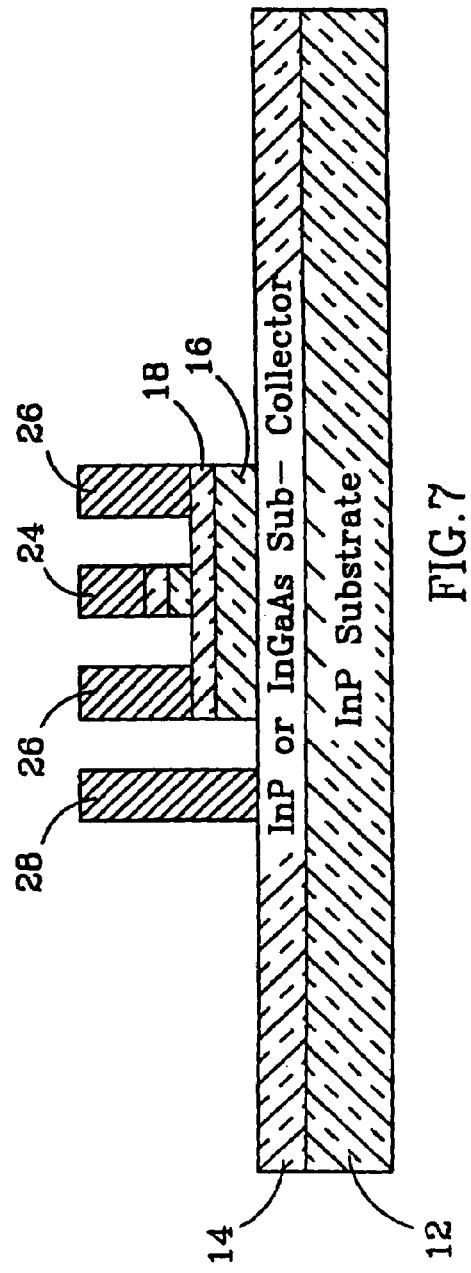
FIG. 7 is a sectional view of the HBT in FIG. 6 after a subsequent fabrication step using the method of FIG. 3.

In step 72 as shown in FIG. 7, the base layer 18 and collector layer 16 are etched to the sub-collector layer 14, except for the portions of these layers under the base and emitter contact metals 24 and 26 and the area between them. In 74 as also shown in FIG. 7, the collector contact metal 28 is deposited on the sub-collector layer 14, also with a suitable method being evaporation.

Figure 8:
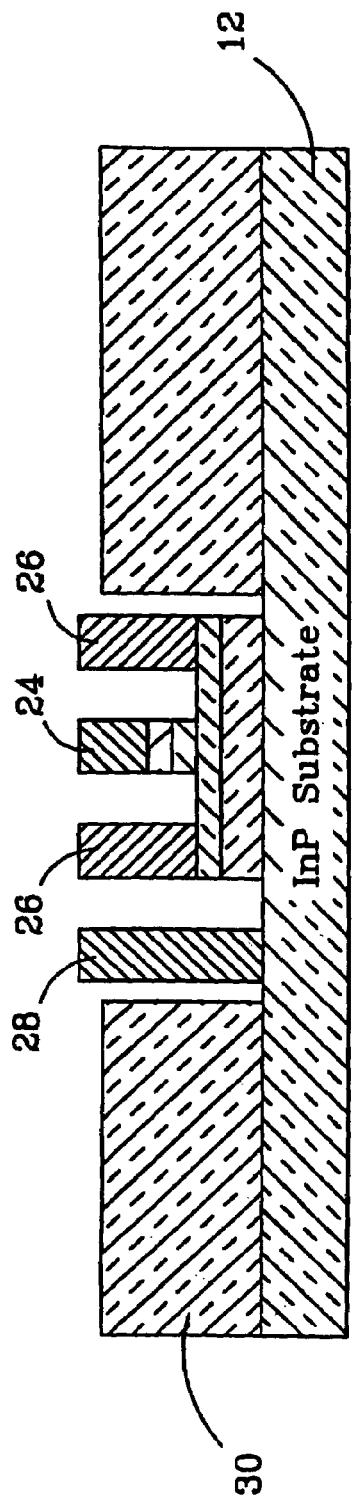
FIG. 8 is a sectional view of the HBT in FIG. 7 after a subsequent fabrication step using the method of FIG. 3.

In step 76 as shown in FIG. 8, the SiO layer 30 is deposited around the HBT's active layers 64 and contact metals. This can be accomplished by first depositing a photoresist material (not shown) over the active layers 64 and contact metals 24, 26, 28. The photoresist is then etched around the active layers 64 and contacts 24, 26, 28, down to the substrate. The SiO layer 30 can then be deposited and the photoresist material can be lifted off to again reveal the active layers and contact metals.

Figure 9:
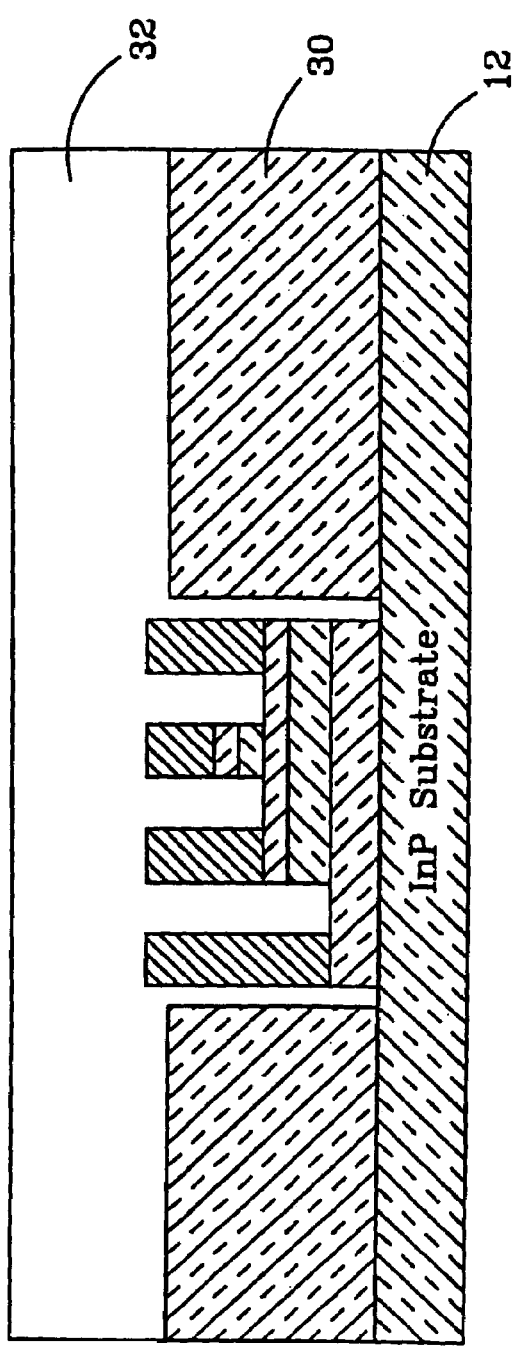
FIG. 9 is a sectional view of the HBT in FIG. 8 after a subsequent fabrication step using the method of FIG. 3.

In step 78 as shown in FIG. 9, a planarization material 32 is then deposited over the entire HBT, including the SiO layer 30. The preferred planarization material also passivates the epitaxial layers and as described above, a suitable material can be a polymide or Benzocyclobutenes (BCB) or any material that passivates the surfaces of the epitaxial layers and also can be etched to a planar surface.

Figure 10:
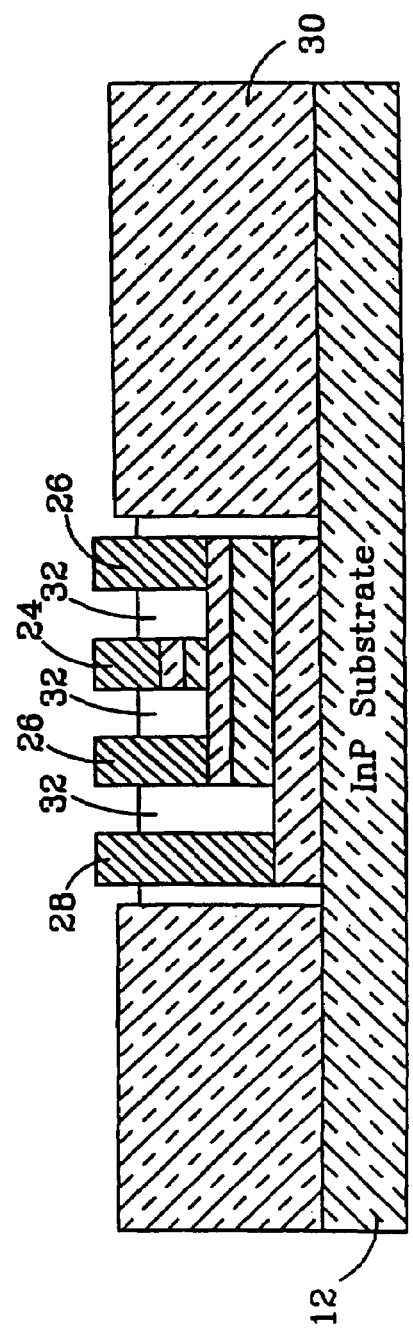
FIG. 10 is a sectional view of the HBT in FIG. 9 after a subsequent fabrication step using the method of FIG. 3.

In accordance with the present invention, in step 80 as shown in FIG. 10, the passivation material 32 is etched to reveal the top portions of the contact metals and to provide a substantially level surface 33 (see FIG. 1) with the surface of the SiO layer 30. In step 82 as shown in FIG. 1, first, second and third planar metals 34, 36 and 38 are deposited over their respective contact metals 24, 26 and 28 for electrical contact to the underlying HBT.

Although the present invention has been described in considerable detail with reference to certain preferred configurations thereof, other versions are possible. As described above, the invention can be used with many different semiconductor devices beyond HBTs. Also, different methods can be used to fabricate devices with planar contacts according to the present invention. In the methods shown, fewer or additional steps can be used and the steps can take place in different sequences. Therefore, the spirit and scope of the appended claims should not be limited to the preferred versions in the specification.

We claim:

1. A method for fabricating a multi-layered semiconductor device, comprising:

depositing a plurality of successive epitaxial layers on a substrate, said substrate extending laterally beyond said epitaxial layers;

depositing a plurality of contact metals on said epitaxial layers, depositing a layer of self alignment material on said substrate, said self alignment material surrounding but not contacting said plurality of epitaxial layers or contact metals;

depositing a planarization material over said, self alignment material, said plurality of epitaxial layers and said plurality of contact metals;

etching said planarization material so it has a planar surface about the same level as the surface of the self-alignment material, and said plurality of contact metals protrude from said planar surface; and depositing a plurality of planar metals on said planar surface, each of said plurality of planar metals isolated from the others and each in electrical contact with a respective one of said plurality of contact metals.

2. The method of claim 1, wherein said planarization material passivates the surfaces of said epitaxial layers.

3. The method of claim 1, wherein said planarization material comprises a material from the group consisting of a polymide or Benzocyclobutenes (BCB).

4. The method of claim 1, wherein said plurality of epitaxial layers and said substrate are made of a material from the group consisting of InP and InGaAs.

5. A method for fabricating a heterojunction bipolar transistor (HBT), comprising:

depositing successive emitter, base, collector and sub-collector epitaxial layers on a substrate, with said substrate being adjacent to said sub-collector layer;

etching said epitaxial layers to provide locations for metal contacts;

depositing emitter, base and contact metals on said emitter, base and sub-collector epitaxial layers, respectively;

depositing a self-alignment material on the surface of said substrate around said epitaxial layers;

depositing a planarization material over and covering the HBT; and etching said planarization material so it has a planar surface about the same level as the surface of the self-alignment material, and said plurality of contact metals protrude from said planar surface.

6. The method of claim 5, wherein said selectively etching step comprises etching said epitaxial layers so that said base layer extends laterally beyond said emitter layer, said sub-collector extends laterally beyond said collector, and said substrate extending laterally beyond said sub-collector.

7. The method of claim 5, comprising the further step of depositing a plurality of planar metals on said planar surface, each of said plurality of planar metals isolated from the others and each in electrical contact with a respective one of said plurality of contact metals.

* * * * *